(12) United States Patent
Watanabe et al.

(10) Patent No.: US 8,093,706 B2
(45) Date of Patent: Jan. 10, 2012

(54) MOUNTING STRUCTURE OF SEMICONDUCTOR DEVICE AND ELECTRONIC APPARATUS USING SAME

(75) Inventors: Shinji Watanabe, Minato-ku (JP); Takao Yamazaki, Minato-ku (JP)

(73) Assignee: NEC Corporation, Tokyo (JP)

( * ) Notice: Subject to any disclaimer, the term of this patent is extended or adjusted under 35 U.S.C. 154(b) by 231 days.

(21) Appl. No.: 12/409,796

(22) Filed: Mar. 24, 2009

(65) Prior Publication Data

US 2009/0243075 A1 Oct. 1, 2009

(30) Foreign Application Priority Data

Mar. 26, 2008 (JP) ................................. 2008-080371

(51) Int. Cl.
*H01L 23/02* (2006.01)
*H01L 23/48* (2006.01)
*H01L 23/52* (2006.01)
*H01L 23/34* (2006.01)
*H01L 29/40* (2006.01)

(52) U.S. Cl. ........ 257/686; 257/685; 257/688; 257/689; 257/692; 257/693; 257/696; 257/723; 257/777; 257/E23.06; 257/E23.063; 257/E23.177

(58) Field of Classification Search .................. 257/685, 257/686, 688, 692, 693, 696, 723, 777, E23.06, 257/E23.063, E23.177, 689

See application file for complete search history.

(56) References Cited

U.S. PATENT DOCUMENTS

| 5,646,446 | A | * | 7/1997 | Nicewarner et al. | 257/723 |
| 6,294,831 | B1 | | 9/2001 | Shishido et al. | |
| 6,300,679 | B1 | * | 10/2001 | Mukerji et al. | 257/738 |
| 6,376,769 | B1 | * | 4/2002 | Chung | 174/524 |
| 6,465,893 | B1 | * | 10/2002 | Khandros et al. | 257/777 |
| 6,504,244 | B2 | * | 1/2003 | Ichinose et al. | 257/723 |
| 6,550,982 | B2 | * | 4/2003 | Auburger et al. | 385/88 |
| 6,646,335 | B2 | * | 11/2003 | Emoto | 257/686 |
| 6,667,480 | B2 | * | 12/2003 | Kajiwara et al. | 250/370.01 |
| 6,768,191 | B2 | * | 7/2004 | Wennemuth et al. | 257/686 |

(Continued)

FOREIGN PATENT DOCUMENTS

JP 3395164 B2 4/2003

(Continued)

OTHER PUBLICATIONS

Notice of Grounds of Rejection issued Oct. 25, 2011 in corresponding Japanese Application No. 2008-080371.

*Primary Examiner* — Ida M Soward

(74) *Attorney, Agent, or Firm* — Sughrue Mion, PLLC

(57) ABSTRACT

A mounting structure includes: at least one semiconductor device having solder bumps as outer terminals and a flexible wiring board with wiring formed thereon. The semiconductor device is structured to be wrapped by the flexible wiring board, the mounting structure is provided with outer electrodes on both sides of the flexible wiring board, one side being a side where outer terminals of the semiconductor device are formed, and the other side being an opposite side thereof. At least one wiring layer is formed on the flexible wiring board. A supporting member is provided covering side faces and a surface of the semiconductor device opposite to the side where the outer terminals are formed and protruding from the side faces of the semiconductor device and extending toward the surface on which the outer terminals are formed.

23 Claims, 5 Drawing Sheets

U.S. PATENT DOCUMENTS

| | | | |
|---|---|---|---|
| 6,876,074 B2 * | 4/2005 | Kim .............................. | 257/686 |
| 6,998,704 B2 * | 2/2006 | Yamazaki et al. ............ | 257/688 |
| 7,425,758 B2 * | 9/2008 | Corisis et al. ................ | 257/686 |
| 7,615,858 B2 * | 11/2009 | Eun ............................... | 257/686 |
| 2001/0040793 A1 * | 11/2001 | Inaba ............................ | 361/749 |
| 2002/0114143 A1 * | 8/2002 | Morrison et al. ............. | 361/749 |
| 2004/0115920 A1 | 6/2004 | Yamazaki et al. | |
| 2004/0156177 A1 * | 8/2004 | Higashitani ................... | 361/777 |
| 2005/0009234 A1 * | 1/2005 | Partridge et al. ............. | 438/109 |
| 2006/0255446 A1 * | 11/2006 | Wehrly, Jr. .................... | 257/688 |
| 2007/0013036 A1 * | 1/2007 | Zhe et al. ...................... | 257/659 |
| 2010/0148335 A1 * | 6/2010 | Mikami et al. ................ | 257/686 |

FOREIGN PATENT DOCUMENTS

| | | |
|---|---|---|
| JP | 2004-146751 A | 5/2004 |
| JP | 2007157878 A | 6/2007 |
| WO | 2007086481 A1 | 8/2007 |

* cited by examiner

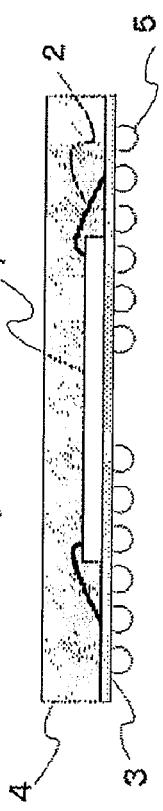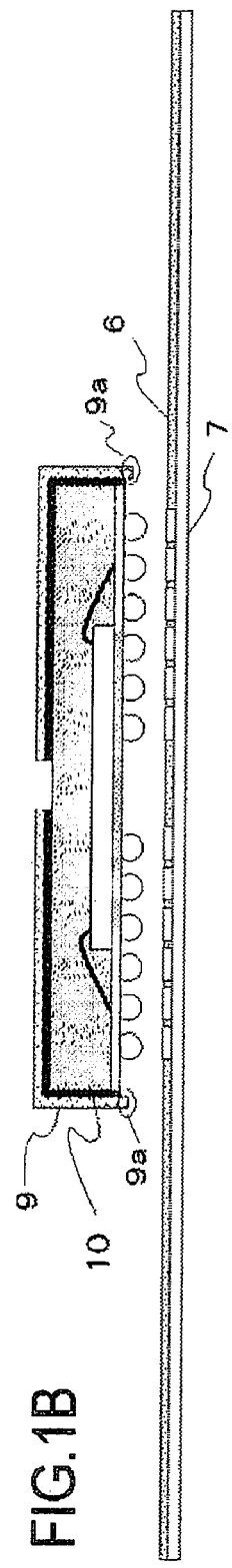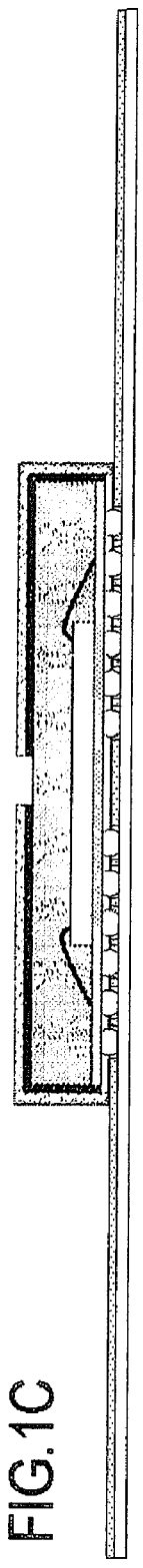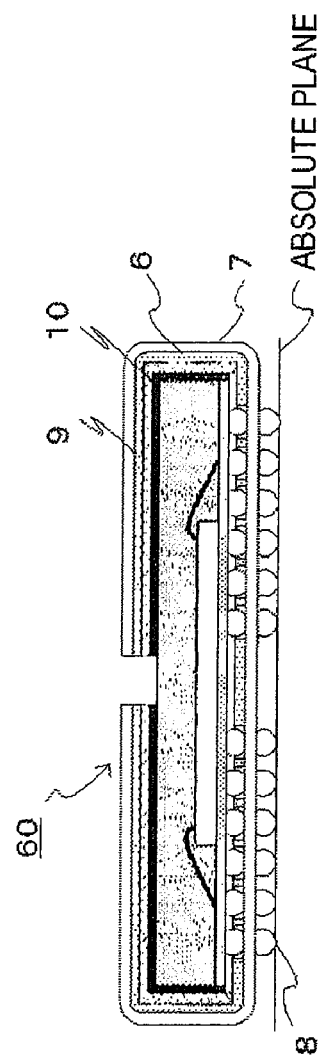
FIG.1A
FIG.1B
FIG.1C
FIG.1D

110: SEMICONDUCTOR DEVICE
112: SUBSTRATE
114: SEMICONDUCTOR CHIP
116: BUMP
118,130,134,142,146,158:
            STRUCTURE
120: ADHESIVE
122: UNDERFIL
124: BALL BUMP
126: CONCAVITY
128: SPACE

101: SEMICONDUCTOR CHIP
102: THERMOPLASTIC RESIN
103: INSULATING RESIN
104: CONDUCTOR
105: TERMINAL PAD
106: PLATE
108: SOLDER BUMP
109: MOTHER BOARD
110: WIRING PATTERN
111: FLEXIBLE INTERPOSER SUBSTRATE

MOUNTING STRUCTURE OF SEMICONDUCTOR DEVICE AND ELECTRONIC APPARATUS USING SAME

TECHNICAL FIELD

Reference to Related Application

This application is based upon and claims the benefit of the priority of Japanese patent application No. 2008-080371, filed on Mar. 26, 2008, the disclosure of which is incorporated herein in its entirety by reference thereto.

This invention relates to a mounting structure of a semiconductor device and particularly relates to a three-dimensional mounting structure formed by laminating a plurality of mounting structures of semiconductor devices. It also relates to an electronic apparatus using the mounting structure.

BACKGROUND

Increase of a number of components due to advanced functions of electronic apparatus and development of miniaturizing or slimming of the apparatus also require miniaturizing or slimming of semiconductor packages themselves. As a semiconductor package suitable for mobile apparatus which is required to be downsized there is a BGA (Ball Grid Array) or CSP (Chip Size Package) as disclosed in Patent Document 1, for example. As shown in FIG. 5 (symbols in FIG. 5 are explained in the figure, added by 100) solder balls are arranged in a grid pattern at the bottom of the package as terminals and this kind of semiconductor package is widely utilized because more terminals can be provided in a narrow area.

Recently a chip-stack type semiconductor package, that is, a plurality of semiconductor chips are stacked in the semiconductor package, is being utilized and particularly plays an important role for mobile apparatuses.

One problem is a high cost of the semiconductor package stacking a plurality of semiconductor chips in the package because a yield after packaging step becomes extremely low when the stacked semiconductor chips are not well inspected or when semiconductor chips which may cause low yields are combined.

Particularly, when using semiconductor chips purchased from other companies, own inspections are necessary to guarantee the quality of the semiconductor chips because the quality of the semiconductor chips themselves cannot be guaranteed to the same extent of the semiconductor packages. Therefore, provision for inspection devices and inspection programs are necessary and it results in higher manufacturing costs.

Thus the applicant proposed a semiconductor package structure of stack-packaged type as shown in FIG. 6 (symbols in FIG. 6 are explained in the figure, added by 100) (Patent Document 2). To manufacture the semiconductor package structure a plurality of semiconductor chips are packaged, then these packages are inspected separately and finally the packages are stacked to form a semiconductor package structure.
[Patent Document 1] JP-Patent No. 3395164
[Patent Document 2]
JP Patent Kokai Publication No. JP-P2004-146751A

SUMMARY OF THE DISCLOSURE

The entire disclosures of Patent Documents 1 and 2 are incorporated herein by reference thereto. The following analyses are given by the present invention.

However, the problem that the equal quality assurance cannot be obtained when semiconductor chips were purchased from other companies remained unsolved and thus the problems of availability of semiconductor chips and high costs were not solved.

Therefore, it can be conceivable to restructure standard semiconductor devices and/or semiconductor packages available in market the quality of which is assured as a "package which can be stacked each other (mounting structure)" instead of structuring high cost semiconductor chips into a package which can be stacked as it is. However, according to the inventors knowledge, there was a difficulty to keep good coplanarity of solder balls when solder balls are used as terminals of a semiconductor device.

As one solution of this problem, the applicant proposed a semiconductor device having a flexible wiring board folded at an outer area of the most outwardly arranged solder balls in a related application (JP-2007-242396, filed on Sep. 19, 2007).

According to a first aspect of the present invention, there is provided a mounting structure comprising at least one semiconductor device having solder bumps as outer terminals and a flexible wiring board with wiring formed on the board. The semiconductor device is structured to be wrapped by the flexible wiring board. Outer electrodes are provided on both of a side on which outer terminals of the semiconductor device are formed and an opposite side of the mounting structure. At least one wiring layer is formed on the flexible wiring board. A supporting member is provided covering side faces and a surface of the semiconductor device opposite to the side on which the outer terminals are formed. The supporting member protrudes from the side faces of the semiconductor device and extends toward the surface on which the outer terminals are formed.

Preferably a protruding length of the supporting member from the side face of the semiconductor device is the same or slightly larger than a height of a solder bump(s) when the semiconductor device and the flexible wiring board are connected each other by a molten solder bump(s) using a reflow method without the supporting member.

Preferably at least a part of a portion of the supporting member that covers the surface of the semiconductor device opposite to the side on which the outer terminals are formed is adhered to the flexible wiring board.

Preferably at least a part of the supporting member that covers the side face of the semiconductor device is adhered to the flexible wiring board.

Preferably an adhesive layer to adhere the supporting member is formed on the inner surface of the flexible wiring board, and a protruding length of the supporting member from the side face of the semiconductor device is the same or slightly larger than a distance between the surface of the semiconductor device on which the solder bumps are formed and a surface of an adhesive layer when the semiconductor device and the flexible wiring board are connected each other by a molten solder bump(s) using a reflow method without the supporting member.

Preferably a thermal expansion coefficient of the supporting member is the same or less than a thermal expansion coefficient of the flexible wiring board.

Preferably the supporting member is fixed in contact with the semiconductor device.

Preferably the supporting member is divided into at least two parts, and at least a part of the side portion (face) of the semiconductor device is fixed in contact with the supporting member.

Preferably the supporting member is divided into at least two parts, and at least a part of the side portion (face) of the semiconductor device and the supporting member are fixed via an adhesive layer.

Preferably the supporting member is fixed with both of the flexible wiring board and the semiconductor device by an adhesive.

The adhesive may be an electrically conductive adhesive.

Preferably the supporting member is adhered to or in contact with the surface of the semiconductor device opposite to the surface on which the outer terminals are formed via a heat conducting medium so that the supporting member plays a role of a radiator plate of the semiconductor device.

The heat conducting medium may be an electrically conductive adhesive or a heat dissipating (radiation) gel.

Preferably the supporting member is made of an elastic material.

Preferably the supporting member is made of an electrically conductive material, and a ground pattern formed on the flexible wiring board and the supporting member are electrically connected via an electrically conductive bump(s).

Preferably an outermost corner portion of the supporting member corresponding to a position at which the flexible wiring board is bent is chamfered in an arc shape.

Preferably at least one adhesive layer is formed on an inner surface of the flexible wiring board, and at least a part of the flexible wiring board is fixed to the semiconductor device or the supporting member by the adhesive layer.

The adhesive layer may be made of a thermoplastic resin or a thermosetting resin before setting.

According to a second aspect of the present invention, there is provided a stacked-type semiconductor device including the mounting structure explained above.

A passive component may be further mounted on the stacked-type semiconductor.

According to a third aspect of the present invention, there is provided an electronic apparatus including the stacked-type semiconductor device explained above.

The meritorious effects of the present invention are summarized as follows, however, without limitative intent. The present invention provides mounting structures of semiconductor devices having a good coplanarity and high yield, mounting structures of semiconductors of stack-packaged type of low costs and electronic apparatuses of high performance, a reduced size and low costs.

BRIEF DESCRIPTION OF THE DRAWINGS

In the accompanying drawings:

FIG. 1A to 1D show a schematic sectional view and a manufacturing method of a mounting structure according to a first exemplary embodiment of the present invention.

PREFERRED MODES

A problem that the inventors have found is explained before describing a mounting structure of semiconductor device according to the present invention. When restructuring standard semiconductor devices and/or semiconductor packages the quality of which is assured and available in market into "package which can be stacked each other (mounting structure)", a situation occurs on the mounting structure as illustrated in FIG. 7.

Figure 7A:
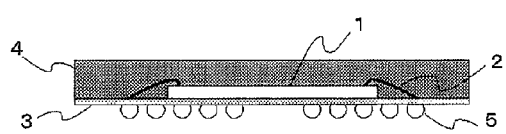
FIG. 7A to 7D show a schematic cross-sectional view and a manufacturing method of a semiconductor device according to a related art without using the structure according to the present invention.

FIG. 7A is a sectional view of a standard CSP package (semiconductor device) having solder bumps as outer terminals which are suitable for high density mounting. A semiconductor chip 1 is mounted on a wiring board 3 and electrodes of the semiconductor chip 1 and wiring patterns of the wiring board 3 are electrically connected by bonding wires 2 using a wire bonding method. The board 3, the semiconductor chip 1 and the bonding wire 2 are covered and sealed by a molding resin 4. Solder bumps 5 as outer terminals to connect with a wiring board for mounting a semiconductor package are formed on a reverse side of the wiring board 3 mounted with the semiconductor chip 1.

Figure 7B:
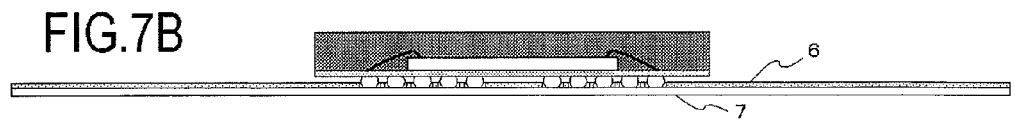
Figure 7C:
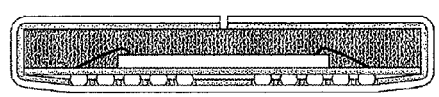
Figure 7D:
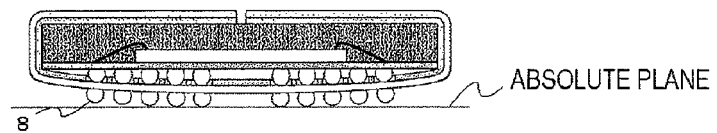

FIGS. 7B to 7D illustrate schematic sectional views and manufacturing steps of a package-stackable semiconductor device (mounting structure). Referring to FIGS. 7B to 7D, the standard package (semiconductor device) having solder bumps 5 as outer terminals is restructured by being covered with folded flexible wiring board 7 having a wiring pattern to electrically connect lower electrodes and upper electrodes of the semiconductor device and thus it becomes possible to stack the package-stackable semiconductors in three dimensions.

FIG. 7B is a sectional view after mounting the semiconductor device on the flexible wiring board 7 having a wiring pattern using a standard method such as a reflow method. A thermoplastic resin 6 is formed on the surface of the flexible wiring board 7 on which the semiconductor device is mounted to adhere the flexible wiring board on the semiconductor device.

FIG. 7C is a sectional view of the restructured semiconductor device which is covered and adhered by the folded flexible wiring board 7. The height of the solder bumps 5 are kept at the original height when the semiconductor device is mounted on the flexible wiring board 7 because the solder bumps are in a solid state at a room temperature. On the other hand a tension in the lateral direction (right- and leftward in the figure) remains in the flexible wiring board 7 at the connecting points to the solder bumps 5 caused by enfolding the semiconductor device.

FIG. 7D is a sectional view of the restructured semiconductor device on which solder bumps 8 for connecting with another wiring board are mounted using a reflow method. The semiconductor device as a whole is heated up to a temperature higher than the melting point of the solder when the solder bumps 8 are formed and therefore the solder bumps 5 are also molten and the tension stress remained in the flexible wiring board 7 is released. As a result the flat portion of the flexible wiring board 7 becomes curved or warped to provide curved cross-section and the resultant curved shape is held after solidification of the solder bumps 5. Thus it becomes difficult to bring all of the solder bumps 8 into contact with one plane (absolute flat plane).

It might be possible to form the solder bumps 8 by local heating to avoid the melting of the solder bumps 5 at the marginal area. However, because the restructured semiconductor device is heated up to more than the melting point of the solder for mounting the semiconductor device on another implemented substrate using a reflow method, the solder bumps 5 will melt and the flexible wiring board 7 will be finally curved.

The most significant problem when mounting the semiconductor device on another wiring board is a poor coplanarity of the solder bumps 8 due to the curving (curved surface) of the flexible wiring board 7. In general, it is known that a defective soldering will generally occur when a coplanarity of solder bumps exceeds 0.08 mm and therefore a standard of the coplanarity of solder bumps of a semiconductor device is 0.08 mm or less. However, it is very difficult to keep the coplanarity 0.08 mm or less in the case as far as the flexible wiring board 7 of the semiconductor device inevitably curves as described above.

Some exemplary embodiments according to the present invention are explained with reference to the drawings.

Exemplary Embodiment 1

FIG. 1 shows schematic sectional views of a first basic exemplary embodiment of a mounting structure according to the present invention and manufacturing method thereof. FIG. 1A is a sectional view of a standard CSP package (semiconductor device) 50 having solder bumps 5 as outer terminals which are suitable for high density mounting. A semiconductor chip 1 is mounted on a wiring board 3 and electrodes of the semiconductor chip 1 and wiring patterns of the wiring board 3 are electrically connected by bonding wires 2 using a wire bonding method. The substrate 3, the semiconductor chip 1 and the bonding wires 2 are covered and sealed by a molding resin 4. Solder bumps 5 as outer terminals to connect with a wiring board for mounting the semiconductor device 50 are formed on a reverse side of the substrate 3 mounted with the semiconductor chip 1.

Although the semiconductor package manufactured by a wire bonding method is assumed in this exemplary embodiment, the present invention is not limited to the semiconductor package manufactured by the wire bonding method. A semiconductor package manufactured by a flip chip method can be also available as far as solder bumps are formed at a lower surface of the semiconductor package.

FIGS. 1B to 1D illustrate schematic sectional views and manufacturing steps of an exemplary embodiment of a package-stackable mounting structure 60 of the semiconductor device 50. The standard packaged-type semiconductor device 50 having the solder bumps 5 as outer terminals is restructured by being wrapped in a flexible wiring board 7 having a wiring pattern to electrically connect lower electrodes and upper electrodes of the semiconductor device 50 and thus it becomes possible to stack the package-stackable semiconductors 60 in three dimensions.

Upper part of FIG. 1B shows a sectional view of the semiconductor device 50 with two supporting members 9 adhered by adhesive 10. Lower part of FIG. 1B shows a sectional view of the flexible wiring board 7 on which a thermoplastic resin 6 is applied. Each of the supporting members 9 has an elongated portion (9a) protruding from a bottom surface of the semiconductor device 50 where the solder bumps 5 are attached. The length of the elongated portion 9a is basically a height of the solder ball 5 when the solder ball is attached on the flexible wiring board 7 by a reflow method without the supporting members subtracted by a thickness of the thermoplastic resin 6, and preferably the end-tip (lowered end) of the elongated portion 9a of the supporting member 9 reaches the surface of the thermoplastic resin 6. Preferably, the length of the elongated portion 9a is slightly longer than the length of the height of the solder ball 5 when attached on the flexible wiring board 7 subtracted by the thickness of the thermoplastic resin 6 to assure the contact with the thermoplastic resin 6. The structure of the elongated portion 9a has a function as a stopper to prevent the curving or warping of the flexible wiring board 7 and can keep a contacting plane of the flexible wiring board 7 and solder balls 5 in a flat state.

In this exemplary embodiment 1 the length of the elongated portion 9a of the supporting member 9 is a length to reach the surface of the thermoplastic resin 6 because the thermoplastic resin 6 is applied on the surface of the flexible wiring board 7 on which the semiconductor device 50 is molten-connected. However, in the case of no thermoplastic resin 6 (not shown), the length of the elongated portion 9a of the supporting member 9 may be a length to reach the surface of the flexible wiring board 7 or longer slightly. The supporting member 9 of this structure also has a function as a stopper to prevent the curving or warping of the flexible wiring board 7.

According to FIG. 1B the supporting member 9 is adhered by the adhesive 10 to both of an upper surface and a side face of the semiconductor device 50. However, either upper surface or side face may be enough to adhere by the adhesive 10. The adhesive can be various kinds of type such as a film type or a liquid type.

FIG. 1C is a mounted state of the semiconductor device 50 shown in FIG. 1B on the flexible wiring board 7 using a reflow method. The heights of the solder bumps 5 become smaller (reduced) due to the molten-connection to the electrodes of the flexible wiring board 7 and the end-tip portion of the elongated portion 9a is in contact with the thermoplastic resin 6 on the flexible wiring board 7.

FIG. 1D is a sectional view of a mounting structure 60 whose flexible wiring board 7 is wrapped by folding and adhered so as to cover the whole supporting members 9 from the state shown in FIG. 1C. The supporting members 9 and the flexible wiring board 7 are fixed each other via the thermoplastic resin 6 by heating the thermoplastic resin 6 and making it sticky.

Preferably the side face(s) of the supporting member 9 is (are) adhered to the flexible wiring board 7 because the wiring board 3 of the semiconductor device 50 is generally made of a glass epoxy substrate. A thermal expansion coefficient of the glass epoxy substrate generally ranges from 10 to 15 ppm/degree C. at a room temperature to a reflow temperature while a thermal expansion coefficient of the flexible wiring board 7 is about 20 ppm/degree C. Then the flexible wiring board 7 expands and becomes loose when heated up during the reflow step resulting in that the coplanarity of the solder bumps 5 becomes poor when the flexible wiring board 7 is not fixed to the side faces of the supporting member 9.

Even when it is difficult to adhere the flexible wiring board 7 to the whole area of the side face of the supporting member 9 due to a roughness of the side face, it is preferable to adhere and fix to at least a part of the side face of the supporting member to the flexible wiring board 7 so as to prevent deterioration of the coplanarity.

The most advantageous feature of this structure is that the structure can be available for a semiconductor device 50 in which almost whole area of the lower surface of the semiconductor device 50 is occupied by the solder bumps 5 and therefore the supporting member 9 cannot be provided between the lower surface of the semiconductor device 50 and the flexible wiring board 7.

In addition, because the supporting member is separated into two pieces, the supporting member 9 can be fitted on both upper surface and side face of the semiconductor device 50. Thus the positioning of the supporting member 9 can be easily done without a high precision fabrication machine.

Increase of a size of the structure due to introduction of the supporting member 9 may be minimized because the semiconductor device 50 and the supporting member 9 can be closely contacted. In addition an outer shape of the packaged structure with the supporting members can be determined accurately due to the contacted structure, and therefore a length of the flexible wiring board 7 to wrap/fold the semiconductor device 50 can be made uniform. Thus a fluctuation of the positions of electrodes formed on the flexible wiring board 7 on the upper surface of the semiconductor device 50 may be reduced.

The heights of the solder bumps 5 after melting become smaller than before melting when the solder bumps melt because each of the solders spreads over each of the electrodes of the flexible wiring board 7. However, the supporting member 9 is covered (wrapped) by the flexible wiring board 7 and therefore the height-reduction of the solders can be controlled by being supported by the supporting member 9 which acts as a stopper. It may reduce the fluctuation of the heights of the mounted semiconductor devices 50 and also it contributes to reduce the fluctuation of the positions of electrodes formed on the flexible wiring board 7 on the upper side of the semiconductor device 50.

Materials for the supporting member 9 are preferably selected from a group that have similar thermal expansion coefficient to that of other wiring board 3, the semiconductor device 50 or the flexible wiring board 7; however, various kinds of other materials may be available.

More preferably the material of the supporting member 9 has a smaller thermal expansion coefficient than that of the flexible wiring board 7. The reason is that the lateral tension of the flexible wiring board 7 remains after the structure is cooled below the reflow temperature because a contraction amount (rate) of the flexible wiring board 7 is larger than that of the supporting member 9 and thus the flexible wiring board 7 has a potency to be kept flat.

Elastic, flexible materials can be also used for the supporting member 9. It becomes possible to generate lateral (in plane) tension at the area of the flexible wiring board 7 where the solder bumps 5 of the semiconductor device 50 are formed by wrapping the supporting member 9 by the flexible wiring board 7 with applying a small pressure to the side portion of the supporting member 9 towards the semiconductor device 50 during a folding/wrapping step of the flexible wiring board 7 as shown in FIG. 1D.

According to the structure above mentioned the coplanarity of the solder bumps 8 can be improved even when the flexible wiring board 7 expands by heat during a thermal reflow treatment step because a tension is applied to the flexible wiring board 7 by the rigidity of the supporting member 9.

The supporting member 9 and the upper portion of the semiconductor device 50 are adhered by the adhesive 10 according to the exemplary embodiment 1 of the present invention. However, a restructured semiconductor device (mounting structure 60) having a good coplanarity can be structured without adhesive between the upper portion of the semiconductor device 50 and the supporting member 9.

A perforated supporting member 9 may be applied without problems. A weight reduction of the mounting structure 60 may be realized by perforating the supporting member 9 and it contributes to a weight reduction of electronic apparatuses using the mounting structure 60 of the present invention.

The mounting structure 60 has the supporting member(s) 9 provided so as to surround (wrap) the semiconductor device 50 and the supporting member(s) 9 is adhered to the flexible wiring board 7 at the side portion of the supporting member(s) 9. The structure as explained above can realize the mounting structure 60 keeping a good coplanarity during the reflow step and even after the reflow step, which is suitable for fabrication of package-stacked semiconductor devices.

An underfill resin may be filled between the lower surface of the semiconductor device 50 and the flexible wiring board 7 (not shown). Then reliability of the connecting portions against a thermal load due to a temperature cycle such as a heat at a startup or changes of environmental temperature and/or a physical impact such as a shock of falling will be improved.

Semiconductor devices (packages) 50 such as memory devices fabricated by different manufacturers may have the same layout of outer terminals but may have different outer shapes. Even in such a case it is possible to restructure different kinds of devices using a common flexible wiring board 7 designed for the largest device and a small sized device 50 can be restructured by using a spacer between the semiconductor device 50 and the supporting member 9 or changing a thickness of the supporting member 9 to accommodate the size of the semiconductor device 50.

Exemplary Embodiment 2

Figure 2:
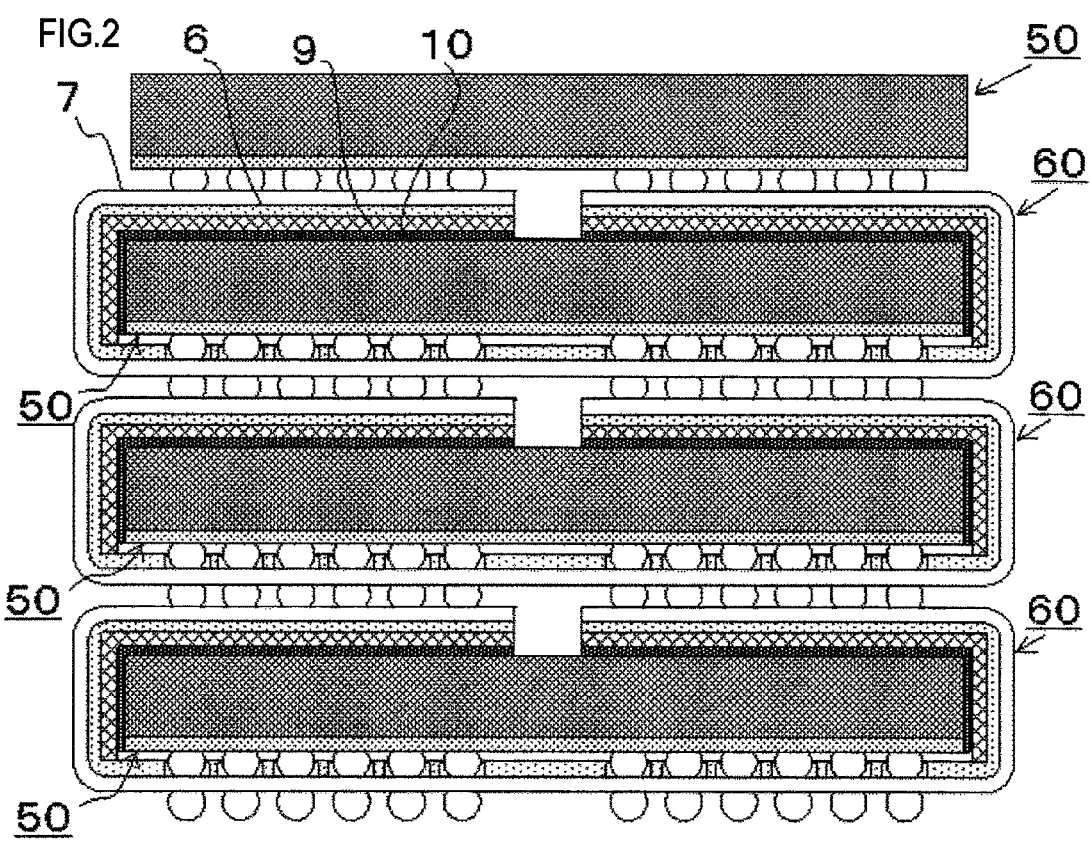
FIG. 2 shows a schematic sectional view of a mounting structure according to a second exemplary embodiment of the present invention.

Next an exemplary embodiment in which a plurality of mounting structures 60 according to the present invention are stacked will be explained with reference to FIG. 2. FIG. 2 shows a schematic sectional view of stacked mounting structures, in which three restructured semiconductor devices (mounting structures 60) according to the present invention at the lower portion and a non-restructured semiconductor device 50 on the top of the three restructured devices are stacked and connected each other by a solder reflow step.

As for the semiconductor device 50 at the top in FIG. 2, it may be the same device as the one that is included in the restructured device 60 or may be a different kind of product, different type of semiconductor device such as a wafer-level CSP, sensing device or passive component such as a capacitor, resistance or inductor. As for the three-stacked portion of the restructured semiconductor devices (mounting structures 60), it can be structured using the same or different kinds of mounting structures 60 and the number of the layers may not be necessarily three.

In addition, all of the stacked semiconductor devices can be the restructured semiconductor devices (mounting structures 60) according to the present invention.

Another effect of the present structure is to promote a heat radiation (dissipation) from the semiconductor device 50 by using a material of high thermal conductivity for the supporting member 9. A metal material such as a copper, aluminum or stainless steel or a carbon product such as graphite, for example, may be preferably used for the supporting member 9 for this purpose. An adhesive 10 of high thermal conductivity is preferably used in such a case such as a conductive adhesive containing metal fillers, for example.

The adhesive 10 is not necessarily made of a curable material but a gel-type heat radiation compound or grease, for example.

Figure 4:
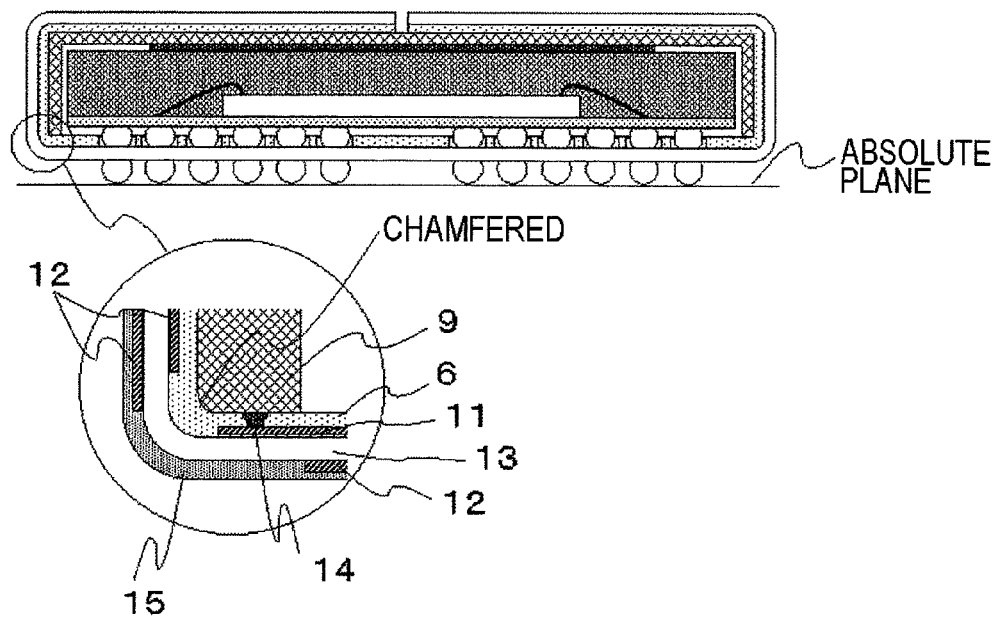
FIG. 4 shows a schematic (partial) cross-sectional view of a mounting structure according to a fourth exemplary embodiment of the present invention.
Figure 5:
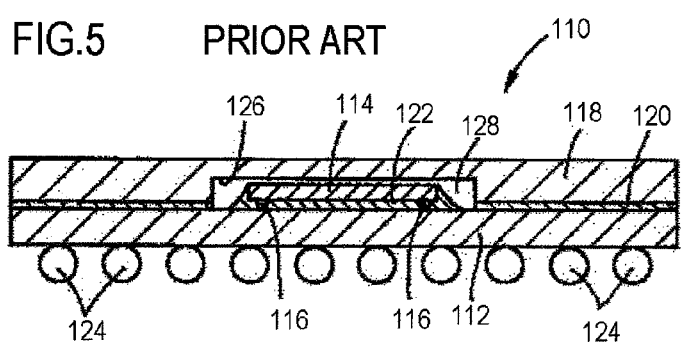
FIG. 5 shows a schematic cross-sectional view of a first conventional example of a semiconductor package of prior art.
Figure 6:
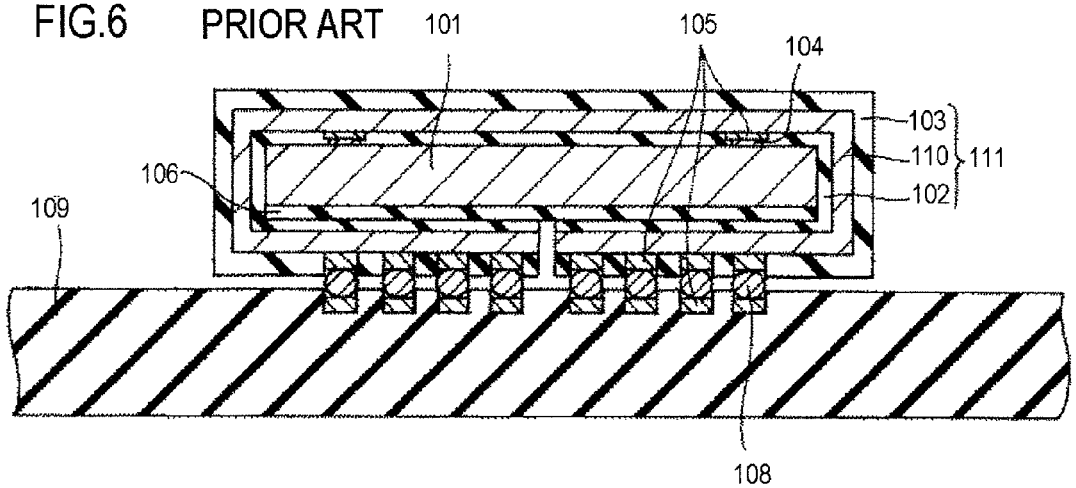
FIG. 6 shows a schematic sectional view of a second conventional example of a semiconductor package.

As shown in an enlarged part of FIG. 4 an outermost corner portion of the supporting member 9 that corresponds to a position where the flexible wiring board 7 is bent (or folded)

is preferably chamfered in an arc shape or C-shape, generally at a radius R. The structure contributes to make it possible to reduce a curvature (enlarge radius of curvature) of the wiring on the flexible wiring board 7 and accordingly it reduces breakings of wiring due to mechanical bending as well as electric noise due to reflections of rapid signals in the wiring.

Exemplary Embodiment 3

Figure 3:
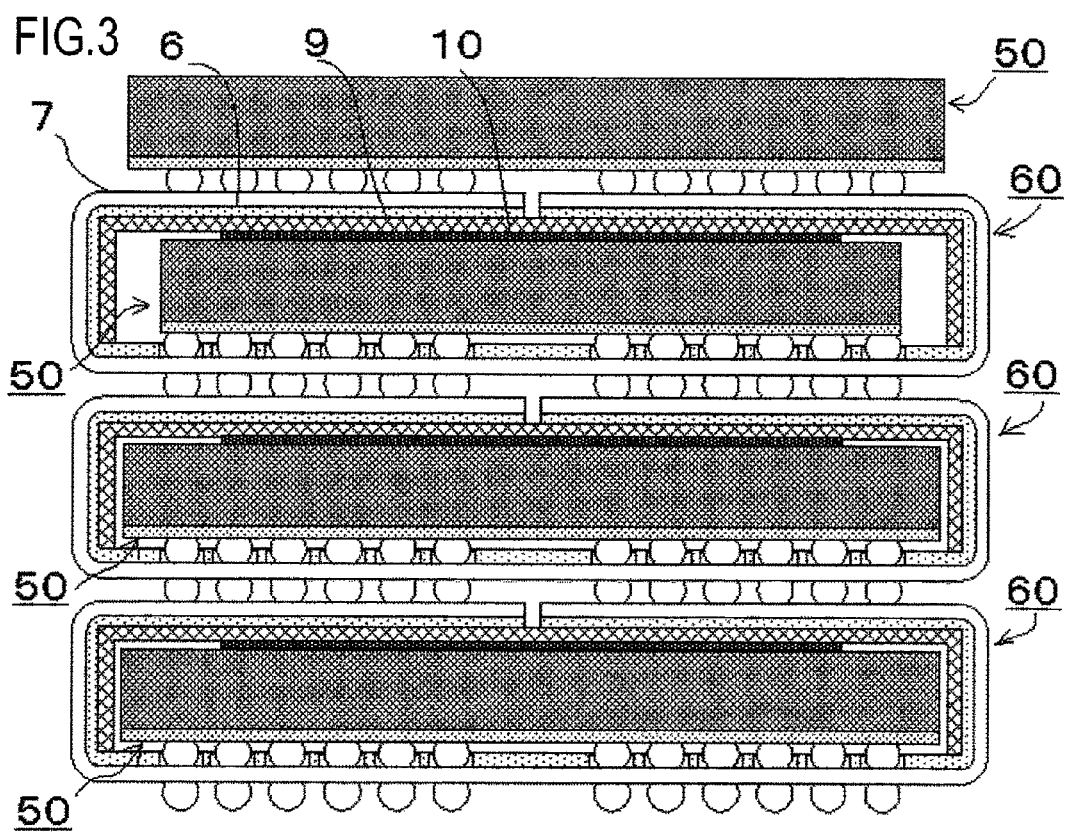
FIG. 3 shows a schematic sectional view of a mounting structure according to a third exemplary embodiment of the present invention.

The mounting structures using separated supporting members 9 are explained in the above exemplary embodiments. However, an integrated supporting member (element) may be also used as a mounting structure. FIG. 3 is an example of such a case and a small space between the semiconductor device 50 and the supporting member 9 is necessary to achieve an easy combination of the semiconductor device 50 and the supporting member 9 in this case. It offers a disadvantage that a total size of a fabricated package becomes larger by the size of the space. However, the structure has a merit that both the supporting member 9 and the flexible wiring board 7 can be commonly used, even when exterior shapes of the semiconductor devices 50 used for the structures are different due to purchasing from various manufacturers, by designing the supporting member 9 and the flexible wiring board 7 so as to fit the largest device. In FIG. 3 a third semiconductor device 50 from the bottom is smaller than the other semiconductor devices 50, but the supporting members 9 and the flexible wiring boards 7 are common to all devices.

Preferably at least a part of the side portion of the supporting member 9 is adhered with the flexible wiring board 7 also in the case of the integrated supporting member 9 to reduce slacking of the flexible wiring board 7 by the heat during a reflow step (not shown).

Exemplary Embodiment 4

Next, another exemplary embodiment of a mounting structure according to the present invention is explained in detail with reference to FIG. 4. An enlarged figure in FIG. 4 (depicted in a circle) is a schematic sectional view of an example that the supporting member 9 and a ground pattern 11 formed on the flexible wiring board 7 of the mounting structure of FIG. 3 is electrically connected via a conductive bump 14. A wiring pattern 12 formed on the flexible wiring board 7, an insulation layer 13 and a cover resin 15 to cover the flexible wiring board 7, and wiring pattern 12 formed on (internally of) the cover resin 15 are also shown in FIG. 4.

A material for the supporting member 9 may be a conductive material such as an aluminum, copper or stainless steel, for example. By means of this structure, the wiring pattern 12 on the flexible wiring board 7 for transmitting signals can be formed as a microstrip line structure when high speed signal processing is carried out between a semiconductor product on the semiconductor device and the semiconductor devices at the lower portion or other wiring board on which the semiconductor devices are mounted.

In general, it is impossible to make a microstrip line structure when the flexible wiring board 7 has only a single wiring layer. However, it becomes possible to make the microstrip line structure even when the flexible wiring board 7 has only one wiring layer by including a supporting member 9 of a material having conductivity and electrically connecting the supporting member 9 and the ground pattern 11 formed on the flexible wiring board 7. Thus a package-stackable restructured semiconductor package (mounting structure) having good electric characteristics for semiconductor products which require very high speed operation can be provided.

It should be noted that other objects, features and aspects of the present invention will become apparent in the entire disclosure and that modifications may be done without departing the gist and scope of the present invention as disclosed herein and claimed as appended herewith. Also it should be noted that any combination of the disclosed and/or claimed elements, matters and/or items may fall under the modification aforementioned.

What is claimed is:

1. A mounting structure comprising:
  at least one semiconductor device having solder bumps as outer terminals and a flexible wiring board with wiring formed thereon, wherein;
  said at least one semiconductor device is structured to be wrapped by the flexible wiring board,
  the mounting structure is provided with outer electrodes on both sides of the flexible wiring board, one side being a side where outer terminals of the semiconductor device are formed, and the other side being an opposite side thereof;
  at least one wiring layer is formed on the flexible wiring board, and
  a supporting member is provided covering side faces and a surface of the semiconductor device opposite to the side where the outer terminals are formed, protruding from the side faces of the semiconductor device and extending toward the surface on which the outer terminals are formed,
  wherein the supporting member is a rigid material.

2. The mounting structure according to claim 1, wherein a protruding length of the supporting member from the side face of the semiconductor device is the same or slightly larger than a height of a solder bump.

3. The mounting structure according to claim 1, wherein at least a part of a portion of the supporting member covering the surface of the semiconductor device opposite to the side on which the outer terminals are formed is adhered to the flexible wiring board.

4. The mounting structure according to claim 1, wherein at least a part of a portion of the supporting member covering the side face of the semiconductor device is adhered to the flexible wiring board.

5. The mounting structure according to claim 1, wherein;
  an adhesive layer to adhere the supporting member is formed on the inner surface of the flexible wiring board, and
  a protruding length of the supporting member from the side face of the semiconductor device is the same or slightly larger than a distance between the surface of the semiconductor device on which the solder bumps are formed and the surface of the adhesive layer when the semiconductor device and the flexible wiring board are connected each other by a molten solder bump(s) using a reflow method without the supporting member.

6. The mounting structure according to claim 1, wherein the supporting member is fixed in contact with the semiconductor device.

7. The mounting structure according to claim 1, wherein the supporting member is divided into at least two parts, and at least a part of a side face of the semiconductor device is fixed in contact with the supporting member.

8. The mounting structure according to claim 1, wherein the supporting member is divided into at least two parts, and at least a part of the side portion of the semiconductor device and the supporting member are fixed via an adhesive layer.

9. The mounting structure according to claim 1, wherein the supporting member is made of an elastic material.

10. The mounting structure according to claim 1, wherein an outermost corner portion of the supporting member corresponding to a position at which the flexible wiring board is bent is chamfered in an arc shape or C-shape.

11. The mounting structure according to claim 1, wherein the supporting member is fixed with both of the flexible wiring board and the semiconductor device by an adhesive.

12. The mounting structure according to claim 11, wherein the adhesive is an electrically conductive adhesive.

13. The mounting structure according to claim 1, wherein the supporting member is adhered to or in contact with the surface of the semiconductor device opposite to the surface on which the outer terminals are formed via a heat conducting medium so that the supporting member plays a role of a radiator of the semiconductor device.

14. The mounting structure according to claim 13, wherein the heat conducting medium comprises an electrically conductive adhesive or a heat dissipating gel.

15. The mounting structure according to claim 1, wherein at least one adhesive layer is formed on an inner surface of the flexible wiring board and at least a part of the flexible wiring board is fixed to the semiconductor device or the supporting member by an adhesive layer.

16. The mounting structure according to claim 15, wherein the adhesive layer is made of a thermoplastic resin or a thermosetting resin before setting.

17. A stacked-type semiconductor device comprising the mounting structure according to claim 1.

18. The stacked-type semiconductor device according to claim 17, wherein a passive component is further mounted.

19. An electronic apparatus comprising the stacked-type semiconductor device according to claim 17.

20. A mounting structure comprising:
at least one semiconductor device having solder bumps as outer terminals and a flexible wiring board with wiring formed thereon, wherein;
said at least one semiconductor device is structured to be wrapped by the flexible wiring board,
the mounting structure is provided with outer electrodes on both sides of the flexible wiring board, one side being a side where outer terminals of the semiconductor device are formed, and the other side being an opposite side thereof;
at least one wiring layer is formed on the flexible wiring board, and
a supporting member is provided covering side faces and a surface of the semiconductor device opposite to the side where the outer terminals are formed, protruding from the side faces of the semiconductor device and extending toward the surface on which the outer terminals are formed, wherein a thermal expansion coefficient of the supporting member is not exceeding a thermal expansion coefficient of the flexible wiring board.

21. A mounting structure comprising:
at least one semiconductor device having solder bumps as outer terminals and a flexible wiring board with wiring formed thereon, wherein;
said at least one semiconductor device is structured to be wrapped by the flexible wiring board,
the mounting structure is provided with outer electrodes on both sides of the flexible wiring board, one side being a side where outer terminals of the semiconductor device are formed, and the other side being an opposite side thereof;
at least one wiring layer is formed on the flexible wiring board, and
a supporting member is provided covering side faces and a surface of the semiconductor device opposite to the side where the outer terminals are formed, protruding from the side faces of the semiconductor device and extending toward the surface on which the outer terminals are formed,
wherein the supporting member is formed by a conductive material, and a ground pattern formed on the flexible wiring board and the supporting member are electrically connected via a conductive bump(s).

22. A mounting structure comprising:
at least one semiconductor device having solder bumps as outer terminals and a flexible wiring board with wiring formed thereon, wherein;
said at least one semiconductor device is structured to be wrapped by the flexible wiring board,
the mounting structure is provided with outer electrodes on both sides of the flexible wiring board, one side being a side where outer terminals of the semiconductor device are formed, and the other side being an opposite side thereof;
at least one wiring layer is formed on the flexible wiring board, and
a supporting member is provided covering side faces and a surface of the semiconductor device opposite to the side where the outer terminals are formed, protruding from the side faces of the semiconductor device and extending toward the surface on which the outer terminals are formed,
wherein the supporting member is a conductive material.

23. The mounting structure according to claim 22, wherein the conductive material comprises at least one of aluminum, copper or stainless steel.

* * * * *